United States Patent [19]
Gates et al.

[11] 3,951,612
[45] Apr. 20, 1976

[54] EROSION RESISTANT COATINGS

[75] Inventors: John E. Gates, Worthington, Ohio; Neil D. Veigel, Novi, Mich.; Melvin F. Browning, Columbus, Ohio

[73] Assignee: Aerospace Materials Inc., Columbus, Ohio

[22] Filed: Nov. 12, 1974

[21] Appl. No.: 523,018

[52] U.S. Cl. ................................................ 29/195
[51] Int. Cl.² .................................... B32B 15/04
[58] Field of Search ........................ 29/195 A, 194

[56] References Cited
UNITED STATES PATENTS

| | | | |
|---|---|---|---|
| 2,048,276 | 7/1936 | Marlies et al. | 29/195 |
| 2,612,442 | 9/1952 | Goetzel | 29/196.2 |
| 2,767,464 | 10/1956 | Nack et al. | 29/194 |
| 3,772,058 | 11/1973 | Bloom | 117/62 |
| 3,796,588 | 3/1974 | Hintermann et al. | 117/71 M |

Primary Examiner—L. Dewayne Rutledge
Assistant Examiner—E. L. Weise
Attorney, Agent, or Firm—Biebel, French & Bugg

[57] ABSTRACT

Composite coatings are formed of a ceramic-type material such as chromium carbide over an intermediate layer of a ductile metal such as nickel on stainless steel turbine compressor blades. Such coatings were found to reduce the erosion by entrained particles to less than 10 percent that experienced by uncoated blades.

5 Claims, 1 Drawing Figure

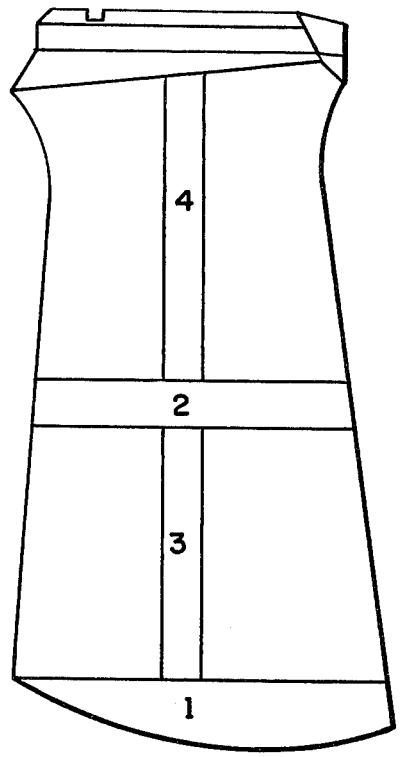

EROSION RESISTANT COATINGS

BACKGROUND OF THE INVENTION

This invention relates to improved erosion-resistant coatings for metal objects which are used under conditions of air turbulence, high stress, and high temperatures. More specifically, the invention concerns the coating of aircraft turbine compressor blades and stators with a composite coating having two phases, the combined properties of which lead to dramatic increases in resistance to erosion caused by impacting particulate matter.

Over the past 20 years, there has been a nearly complete conversion of commercial and military aircraft to the use of turbine engines for propulsion. This has resulted in an increase in mechanical reliability and in increased efficiency, particularly at high altitudes. However, a number of other problems are faced by turbine engines, including blade wear in the compressor section due to the impact of particulate matter.

In helicopter applications this problem is intensified by the unique erosion problems engendered by the self-induced air turbulence associated with take-off, landing, and hovering near the ground. Small gas turbines powering helicopters, hovercraft, etc., over dusty, unimproved land areas routinely ingest up to 25 pounds of sand and dust every hour of low altitude operation.

The abrasive particles impact the critical air-foil surfaces of compressor blades and vanes, eroding the thin metal tips and leading edges. This results in rapid progressive deterioration of engine performance.

One approach to a solution for this problem is a filtration system to remove dust and sand from the air stream. However, dust filters and separators invariably decrease engine efficiency and require constant maintenance.

A second approach is to select blade and vane materials with improved inherent erosion resistance. Even still, high strength metallic materials, including the 12–17 percent chromium-stainless steel and titanium alloys which are used for current compressor blades and vanes, do not possess adequate intrinsic resistance to dust erosion. In addition, it has been found that the use of even harder materials in blade construction leads to an undesirable loss of ductility and impact resistance.

Another approach has been to coat the standard blade materials with an erosion-resistant outerlayer. The difficulty here arises in obtaining good adhesion. For this reason, the patent literature reveals that a number of diffusion coating techniques, multi-layer coating techniques, etc., have been devised. For example in U.S. Pat. No. 3,594,219 to Maxwell, it is disclosed that a nickel or cobalt-base superalloy undercoating may be used as an adherent base for aluminide overcoatings. Likewise, Darnell in U.S. Pat. No. 3,368,914 suggests that one means of obtaining a better coating is to diffuse-coat a metal carbide onto the steel substrate and then bond a thicker metal carbide coat over that. Similarly, in U.S. Pat. No. 3,772,058 to Bloom there is disclosed a vapor deposition method for applying a hard ceramic layer of titanium carbonitride over a nickel layer.

While such ceramic-type coatings are more erosion-resistant, these materials are brittle and lead to reduced fatigue life. For example, tests on coatings such as Ti-Kote-C, a titanium carbonitride ($TiC_{0.5}N_{0.5}$) solution of Texas Instruments, showed a 30–50 percent loss in airfoil fatigue strength.

Apparently as a partial solution for this problem, it has been proposed to use a more ductile nickel or cobalt layer beneath the hard outer layer. Additional examples of this are found in U.S. Pat. No. 2,767,464 to Nack wherein there is used a nickel layer having a slight tendency to yield and take up the effects of applied forces to relieve the strains in the more brittle chromium layer used as the outer coating. Similarly, Geotzel in U.S. Pat. No. 2,612,442 utilizes a nickel or cobalt intermediate layer between the steel blade and the hard titanium carbide outer layer.

Even still, the dual coatings disclosed in these patents, while an improvement in erosion-resistance over the bare blade, do not go as far as desired in solving the problem. As should be apparent every increase in erosion resistance gives added operating hours to aircraft use, leading to considerable economic savings in repair and replacement costs. Turbine blade erosion resistance remains, therefore, a major objective in the aircraft industry.

The mechanism by which improvement in erosion resistance is obtained is not well understood. Hardness, i.e., scratch resistance, is certainly a factor in decreasing local erosion on a microscale. However, the impact resistance of the material is important as it relates to the transmission of the shock wave from the impacting particles, the resultant stresses set up within the material, and the reaction of the coating to these stresses. A common example of failure by such stresses is the expulsion of material from a crater in the direction opposite to that of impact when plate glass is penetrated by a bullet. These first two factors relate to the wear resistance of monolithic materials. When such materials are applied as coatings to dissimilar materials such as those used in compressor blades, additional factors come into play. For thin but continuous coatings containing zero residual stress, when the modulus of elasticity of the substrate is appreciably less than that of the coating, the coating may not be adequately supported on impact, and it may fail by flexure beyond its elastic limit. In continuous coatings, adhesion of the coating to the substrate is important in that impact of a particle generates a reflected tensile stress at the interface which may result in separation of the coating and lack of support for subsequent impacts.

In cases where the coefficient of thermal expansion of the coating is higher than that of the substrate, tensile stresses are set up in the coating on cooling which tend to crack the coating. In cases where the coefficient of expansion of the coating is less than that of the substrate, and the coating is adherent, a pattern of cracks with loss of material along the cracks can result from compressive stress.

Where the coating is crazed, i.e., separated islands of coating material in a reticule of open cracks, and where the coating adhesion is good, this does not necessarily obviate the value of the coating. However, the stress pattern generated by impact near a crack is more deleterious than that generated by impact in the center of one of these coating islands, and the erosion resistance of such a coating is strongly dependent on the adhesion of the coating material to the substrate.

When adhesion of the coating material to the substrate is particularly good, the erosion resistance may be characterized by the further cracking of the coating into fragments.

Obviously when the coating is penetrated in any of the above mechanisms, subsequent erosion is that characteristic of the substrate material and ultimate failure of the blade system results.

Another factor in the effectiveness of the coatings is their ability to prevent crack propagation from the outer portion of the coating into the substrate. For example, it has been shown that a coating of brittle tungsten carbide directly on the blades of concern to this invention underwent premature fatigue failure, presumably because of crack propagation. The presence of the low-modulus relatively ductile nickel in the coating may help prevent this type of failure, but even then tungsten carbide over nickel does not give the desired increases in erosion resistance.

Overcoming or minimizing all of these factors is necessary to achieve an erosion resistant coating which is superior to those previously known.

SUMMARY OF THE INVENTION

The present invention is a two-layer coating which overcomes the problems encountered in the past. The blended, layered coating of the present invention is highly resistant to thermal shock, mechanical shock and erosion.

The substrate is a metal alloy such as stainless steel (i.e., a chromium-steel alloy, a chromium-steel-titanium alloy), nickel base alloys or titanium alloys. In particular, it is proposed that the substrate be conventional turbine compressor blades, vanes or stators which are subjected to air turbulence, stress, high temperatures, and other factors resulting in erosion.

The first layer of coating, i.e., the intermediate layer in the substrate-intermediate layer-outer layer structure, is a relatively ductile metal such as nickel or nickel cadimium alloy. Preferably the coating is chemical vapor deposited by thermal decomposition. Thus, nickel may be deposited on the stainless steel substrate by thermal decomposition of nickel carbonyl.

The outer layer is a ceramic-type material such as chromium carbide having a hardness of about 1200–1300 Knoop Hardness Number (KHN). The chromium carbide outer layer may be deposited by thermal decomposition of dicumene chromium.

The resultant material is a blended coating of a ceramic-type material of intermediate hardness into a ductile metal sublayer which is metallurgically bonded to the blade. The harder outer layer will, as discussed, resist the erosive effects of entrained material in the turbine intake. The ductile intermediate layer will, as also previously discussed, help prevent premature failure due to crack propagation.

In combination, however, the outer chromium carbide layer blended with a nickel intermediate layer, results in a coating having both of these advantages and additional ones too without any of the disadvantages of prior known coatings.

The composite coating of the present invention is applied in such a way as to leave residual compressive stress and, thus, decrease failure on impact which occurs in coatings having a modulus of elasticity appreciably more than the substrate. Likewise, since the nickel layer is ductile and partially deforms in the cooling process, it allows some strain in the coating - substrate combination to reduce residual stresses. Finally, the composite coating compensates for the thermal expansion mismatch between the ceramic and metal, and provides an excellent shock resistant bond between the ceramic and metal. All of these features provide in combination (1) an excellent bond between the ceramic layer and blade, to (2) prevent cracks starting in the ceramic layer from progressing into the blade, and to (3) reduce the mechanical stress resulting from the large difference in thermal expansion between the metal and ceramic.

In addition, the use of an outer coating of intermediate hardness has been found essential in reducing the problem of spalling which occurs in hard brittle coatings even when used in conjunction with a ductile inner layer. This is accomplished without decreasing in any way the fatigue life of the substrate.

Accordingly, it is a primary object of the present invention to provide an erosion-resistant coating on a metal alloy substrate having a ductile first layer and a ceramic-type outer layer of a hardness intermediate between a hard metal such as chromium and a hard ceramic such as tungsten or titanium carbide.

Another object of the present invention is to provide turbine compressor blades, vanes and stators having such a coating.

Other objects and advantages of the invention will be apparent from the following description, the accompanying drawing and the appended claims.

BRIEF DESCRIPTION OF THE DRAWING

The sole FIGURE in the drawing, shows a coated T58–GE–10 engine compressor blade as cut into sections for test evaluation according to the example.

DESCRIPTION OF THE PREFERRED EMBODIMENT

In a T58–GE–10 engine first stage compressor rotor, there are 30 blades. At present a typical blade material is an AM–355, cast stainless steel alloy. It is turbine compressor blades of this description which may effectively be rendered erosion resistant by the coatings of the present invention, although, blades of other stainless steel compositions (AM–410, AM–350, etc.), or other metal alloy substrates intended for service under similar conditions may also be protected in this manner.

The substrate is first coated with a first layer of ductile metal or metal alloy, such as nickel. For the purposes of the present invention this coating may be by thermal decomposition of nickel carbonyl, $Ni(CO)_4$ — a material which vapor decomposes readily at 160°C. The coatings may be applied at reduced pressures with heat supplied by a 10,000 cycle Tocco induction unit. Thus, a clean, stainless steel substrate (which may be preheated) is coated by pyrolysis of nickel carbonyl at 120°–260°C. Generally thicknesses from 0.3 to 0.8 mil may be used.

A ceramic-type outer layer is coated over the first layer by thermal decomposition of dicumene chromium. The pyrolysis of chromium dicumene is conducted at 450°–650°C. The chromium carbide ($Cr_7C_3$) has a KHN of 1200–1300. Generally thicknesses from 0.4 to 3.0 mils may be used. Other ceramic-type materials of a like hardness and characteristics may also be used.

The temperatures used throughout are low enough that for the most part the temper of the stainless steel is not effected.

As an example, in an effort to test coatings of the present invention with uncoated blades and blades having other carbide outer coatings other than chromium carbide a number of tests were run. Type AM–355 stainless steel T–58 first stage compressor blades were used. Four sets were coated as follows:

1. Boron carbide particles in a matrix of nickel prepared by electroplating of nickel from a solution containing a suspension of $B_4C$ particles;
2. An inner layer of nickel, an intermediate layer of tungsten and tungsten carbide co-deposited with nickel, and an outer layer of tungsten and tungsten carbide, all of the materials having been deposited by thermal decomposition of the respective carbonyl compounds;
3. An inner layer of nickel and an outer layer of tungsten and tungsten carbide co-deposited with nickel, all deposited by thermal decomposition of the respective carbonyls;
4. An inner layer of nickel and an outer layer of chromium carbide, the nickel having been deposited by thermal decomposition of nickel carbonyl and the chromium carbide by thermal decomposition of dicumene chromium.

The details of the first set of coatings is given in the following table:

TABLE I

Specimen Identification, Nos. 255, 260, 320, and 325, all coated similarly.
- Initial Cleaning - Washing in alkaline cleaner
- Anodizing Cleaning - Anodizing in the alkaline cleaner for 30 sec at 0.5 amp in.$^{-2}$
- Rinse - water
- Acid treatment - HCl (conc) 5 min.
- Nickel Strike - Wood's nickel bath, 95–100°F, 6 min at 0.7 amp in.$^{-2}$
- Final Coating - 8 min. at 1.7 amp in.$^{-2}$ in agitated bath containing
  - $NiSO_4.6H_2O$    330 gl$^{-1}$
  - $NiCl_2.6H_2O$    45 gl$^{-1}$
  - $H_3BO_3$    40 gl$^{-1}$
  - $B_4C$ (2μ dia)    75 gl$^{-1}$

TABLE I-continued (pH = 1.2, temp = 195°F)
Post coating treatment - Removal of excess coating at corners with No. 400 abrasive paper Boron content of coating, vol. %

| | Minimum | Maximum | Average |
|---|---|---|---|
| Specimen No. 7 | 12.5 | 23.5 | 18.0 |
| Specimen No. 8 | 8.0 | 12.5 | 10.0 |

Approximate coating thickness - 1.0 to 1.5 mils

Sets (2), (3) and (4) were coated in the manner set forth in Table II below:

Table II

| Specimen Identification | Blade Type | Coating | Specimen Temp.,C | Outer Coating Temp.,C | Ni(CO)$_4$ Temp.,C | Approximate Coat Thickness, mil | Hardness of outer layer KHN 25g* |
|---|---|---|---|---|---|---|---|
| W-1 | Used | Ni | | | | | |
| | | Ni+WC$_x$+W | ≈190 | 0 | 70 | ≈ 0.25 | |
| | | WC$_x$+W | ≈370 | ≈ 70 | ≈ 90 | ≈ 0.25 | |
| | | | ≈370 | ≈ 80 | ambient | ≈ 0.25 | (1800) |
| W-4 | 10 | Ni | 180 | ambient | 75 | 0.6–0.8 | |
| | | Ni WC$_x$+W | ≈370 | 60–80 | 75 | 1.3–3.0 | (1430) |
| C-1 | 10 | Ni | 185–205 | ambient | 70–80 | ≈ 0.6 | |
| | | ≈ Cr$_7$C$_3$ | 510–525 | 77–127 | ambient | ≈ 0.8 | (1266) |
| C-2 | 8 | Ni | 185–205 | | | ≈ 0.6 | |
| | | ≈Cr$_7$C$_3$ | 510–525 | ambient | 70–80 | ≈ 0.8 | 1266 |
| | | | | 77–127 | ambient | | |

*Hardness measured on comparison blade, except for C-2 measured on section from tip.

These specimens along with two uncoated blades were subjected to a dynamic erosion test under the following conditions:

Test duration — 16.5 hr.
Test temperature — ambient
Airflow — 12.4 – 12.7 lb/sec.$^{-1}$
Rotor speed — 11,000 RPM
Abradent — Arizona coarse road dust
Abradent flow — 15 lb/hr$^{-1}$ The dynamic erosion test rig consists of a standard T58–GE–10 engine first stage rotor, front frame, bullet nose, and bellmouth. An inlet basket, close coupled to the bellmouth, allows a uniform, dispersed flow of measured abradent to enter the bellmouth. A calibrated feeder supplied the abradent through a funnel ejector to the inlet basket.

The Arizona coarse road dust (0–200 microns) at a concentration of 0.01 gm/ft$^3$ used. The blades were individually weighed prior to the test, after five hours of test, and at 16.5 hours test duration. In addition, the condition of the installed blades was monitored throughout the test.

The results in terms of weight loss are given below in Table III.

Table III

| Specimen Identification | Blade Type | Coating Description | Lot Coating, mg | Hardness Outer Layer, KHN,25g | Rate of Weight Loss, mgh$^{-1}$ plus net loss, (mg) 5 hr | 16.5 hr |
|---|---|---|---|---|---|---|
| Std A | | uncoated | — | — | 71 (354) | 76 (1216) |
| Std B | | uncoated | — | — | 68 (334) | 69 (1142) |
| 255 | | v/o B$_4$C in Ni | | | 76 (381) | 77 (1270) |
| 260 | | | | | 89 (444) | 71 (1171) |
| 320 | | | | | 74 (368) | 75 (1231) |
| 325 | | | | | 72 (357) | 72 (1189) |
| W-1 | Used | ≈ 0.25 mil Ni ≈ 0.25 mil Ni + WC$_x$+W ≈ 0.25 mil WC$_x$+W | 470 | (1800) | 65 (232) | 56 (923) |
| W-4 | 10 | 0.6–0.8 mil Ni 1.3–3.0 mil Ni+WC$_x$+W | 490 | (1430) | 30 (148) | 42 (696) |
| C-1 | 10 | ≈ 0.6-mil Ni ≈ 0.8-mil Cr$_7$C$_3$ | 70 Ni 80 Cr$_7$C$_3$ | (1266) | 3.6 (18) | 6.2 (102) |
| C-2 | 8 | ≈ 0.6 mil Ni | 60 Ni | 1266 | 4.6 (23) | 5.8 (96) |

Table III-continued

| Specimen Identification | Blade Type | Coating Description | Lot Coating, mg | Hardness Outer Layer, KHN,25g | Rate of Weight Loss, mgh⁻¹ plus net loss, (mg) 5 hr | 16.5 hr |
| --- | --- | --- | --- | --- | --- | --- |
| | | ≈ 0.8-mil Cr₇C₃ | | 80 Cr₇C₃ | | |

Four sections were cut from each blade and numbered as indicated in the drawing. Generalized observations based on the metallographic examination are given in Table IV below.

Table IV

| Specimen No. | Section No. (See the Figure) | | | | | | | |
| --- | --- | --- | --- | --- | --- | --- | --- | --- |
| | 1 | | 2 | | 3 | | 4 | |
| | A(1) | B(1) | A | B | A | B | A | B |
| C-1 | 3(2) | 3 | 1 | 2 | 2 | 2 | 1 | 2 |
| C-2 | 2 | 2 | 1 | 2 | 2 | 3 | 1 | 3 |
| W-1 | 2 | 0 | 3 | 1 | 3 | 2 | 2 | 0 |
| W-4 | 3 | 3 | 2-1 | 2-1 | 2 | 3 | 1 | 0 |
| 255 | 2 | 0 | 2 | 0 | 2 | 0 | 3 | 0 |
| 260 | 2 | 0 | 3 | 2 | 3 | 1 | 3 | 0 |
| 320 | 3 | 0 | 2 | 0 | 3 | 0 | 3 | 0 |
| 325 | 3 | 2 | 1 | 0 | 3 | 0 | 3 | 0 |

(1) A = Convex side.
    B = Concave side.
(2) Rating Code -  0 = Coating completely removed
                   1 = Severe attack of coating
                   2 = Moderate attack of coating
                   3 = Little apparent loss of coating.

This data may be summarized as follows:

| Blade Section No. (See the Figure) | Condition of coating after the 16.5 hour Engine Test |
| --- | --- |
| 1 Convex side | All coatings survived |
| 1 Concave side | Only coatings on C-1, C-2, W-4, and 325 survived |
| 2 Convex side | All coatings survived |
| 2 Concave side | Only coatings on C-1, C-2, W-1, W-4, and 260 survived |
| 3 Convex side | All coatings survived |
| 3 Concave side | Only coatings on C-1, C-2, W-1, W-4, and 260 survived |
| 4 Convex side | All coatings survived |
| 4 Concave side | Only C-1 and C-2 survived |

As can be seen the uncoated blades showed an average weight loss of approximately 69.5 mg/hr. for the first five hours and approximately 72.5 mg/hr. for the remaining 11.5 hours of test. The nickel-boron carbide coated specimens (255, 260, 320, and 325) showed a completely ineffective coating response with weight losses averaging greater than the uncoated blades. Nickel-tungsten carbide coated blades (W-1 and W-4) were somewhat better compared to the uncoated blades. However, the nickel-chromium carbide coated blades of the present invention (C-1 and C-2) were an order of magnitude better in weight loss.

In addition, the metallographic observations showed specimens C-1 and C-2 maintained the chord width dimensions at the root and midspan of the airfoil and showed a minimum loss at the blade tip. The other blades tested did not. Fortunately, the densities of nickel (8.9 g/cm⁻³) and Cr₇C₃(≈7) are sufficiently similar to that of type 355 stainless steel (7.7) that volumetric comparison can be made on the basis of weight loss for coatings involving these materials. However, the densities of tungsten (19.2 g/cm⁻³) and its carbides (W₂C = 17.15, WC = 15.63) differ from those of the substrate sufficiently that the data for the tungsten-containing coatings must be qualified.

Although because of the above factors, it is not possible to treat the data of Table III in a quantitatively exhaustive manner, several significant conclusions can be drawn:

1. As might be expected the erosion of the uncoated specimens is uniform both from specimen to specimen and over the two time periods covered by the test;

2. The coatings formed of boron carbide particles in a nickel matrix did not improve the erosion resistance;

3. Both of the tungsten-containing coatings increased the erosion resistance over that experienced by the uncoated blades; to put the coating loss on a volume basis equivalent to stainless steel, the 5-hour loss for specimen W-1 should be decreased. On the assumption that the 5-hour coating loss is of material having a density of ≈16, the volume erosion loss is equivalent to 32 mg/hr or ≈45% that of the bare stainless steel. The fact that the rate of erosion of specimen W-1 decreased with time, plus the fact that the total weight loss exceeded the coating weight indicates that the loss during the test represented a combination of coating loss and substrate loss, due to non-uniform erosion. This is borne out by examination of the specimens;

4. In the absence of an analysis of the coating of Specimens W-4, it is not possible to apply a density correction with even the limited confidence given to the Specimen W-1 correction. It can be said that the performance was at least as good as that of W-1, and probably better;

5. In the case of the chromium carbide coatings on the nickel intermediate, the 5-hour weight losses indicate an erosion of less than 7% that of the bare stainless steel. The increase in erosion rate with time suggests a non-uniform erosion resulting in loss of substrate. This is confirmed by the observation of eroded pin holes in the coating. Even the 16.5 hr. weight loss is less than 10% that experienced by the bare stainless steel. This is an order of magnitude better than the others.

6. It is significant that of the coatings for which hardness data were obtained, the most erosion resistant material was that with a hardness between that of the nickel and the hardest material (the tungsten carbide).

7. In regard to the other erosion-resistant features, the specimens C-1 and C-2 were superior to all the other blades sampled.

This test shows that the coatings of the present invention give superior performance to all others with the combination of a nickel and chromium carbide coating and, thus, offers a real breakthrough in the area of erosion resistance.

Additional tests for fatigue on a rotating beam apparatus and for the effect of salt spray showed that specimens coated in accordance with the present invention maintained the integrity of uncoated blades. There was no indication of either poor adhesion or excessive salt water corrosion.

While the articles herein described constitute preferred embodiments of the invention, it is to be understood that the invention is not limited to these precise articles, and that changes may be made therein without departing from the scope of the invention which is defined in the appended claims.

What is claimed is:

1. An erosion-resistant coated article comprising a metal alloy substrate selected from the group consisting of stainless steel, nickel, and titanium alloys, a first coating of a low-modulus, ductile nickel metal and a second coating of an erosion-resistant, ceramic-type chromium carbide material having a hardness of about 1200–1300 KHN.

2. A coated article as set forth in claim 1 wherein said substrate is a turbine compressor blade.

3. A coated turbine compressor blade as set forth in claim 2 wherein said blade comprises as a base material a stainless steel alloy.

4. A coated turbine compressor blade as set forth in claim 3 wherein said blade comprises as a base material a chromium-steel-titanium alloy.

5. A coated turbine compressor blade as set forth in claim 4 wherein said nickel layer and said chromium carbide layer are chemical vapor deposited layers blended into one another.

* * * * *